United States Patent
Takahashi et al.

[11] Patent Number: 5,888,646
[45] Date of Patent: Mar. 30, 1999

[54] SURFACE ACOUSTIC WAVE DEVICE

[75] Inventors: Yoshihiro Takahashi; Yasushi Yamamoto; Natsuhiko Sakairi, all of Tokyo; Shin-Ichi Shikata, Hyogo; Hideaki Nakahata, Hyogo; Kenjiro Higaki, Hyogo; Satoshi Fujii, Hyogo; Hiroyuki Kitabayashi, Hyogo, all of Japan

[73] Assignees: NEC Corporation, Tokyo; Sumitomo Electric Industries, Ltd., Osaka, both of Japan

[21] Appl. No.: 808,956

[22] Filed: Feb. 19, 1997

[30] Foreign Application Priority Data

Feb. 19, 1996 [JP] Japan ................................. 8-056992

[51] Int. Cl.$^6$ .................................................. H01L 41/16
[52] U.S. Cl. ................. 428/336; 310/313 R; 310/313 A; 428/210; 428/408; 428/701; 428/702
[58] Field of Search ............................ 310/313 R, 313 A; 428/210, 408, 701, 702, 336

[56] References Cited

U.S. PATENT DOCUMENTS 5,061,870 10/1991 Ieki et al. ................................. 310/313
5,160,869 11/1992 Nakahata et al. ........................ 310/313
5,576,589 11/1996 Dreifus et al. ........................... 310/313

FOREIGN PATENT DOCUMENTS

A0517239 12/1992 European Pat. Off. .
A0588261 3/1994 European Pat. Off. .
5-83078 4/1993 Japan .

OTHER PUBLICATIONS

S. Shikata et al., "1.5 GHz Saw Bandpass Filter Using Poly–Crystalline Diamond," 1993 Ultrasonics Symposium, pp. 277–280.

Primary Examiner—Archene Turner
Attorney, Agent, or Firm—Sughrue, Mion, Zinn, Macpeak & Seas, PLLC

[57] ABSTRACT

A surface acoustic wave device comprises a diamond layer (12) or a substrate (11) with a diamond layer (12) formed thereon, an Al electrode (13) formed on the diamond layer (12), and a ZnO piezoelectric thin film layer (14) formed on the diamond layer (12) with the Al electrode (13) covered by the ZnO piezoelectric thin film layer (14). The ZnO piezoelectric thin film layer (14) has a thickness h1 within a range defined by $0.65 \leq kh1 \leq 0.75$ while the Al electrode (13) has a thickness h2 within a range defined by $0.03 \leq kh2 \leq 0.04$, where k is given by $k=2\pi/\lambda$ and $\lambda$ represents an electrode period.

9 Claims, 10 Drawing Sheets

5,888,646

SURFACE ACOUSTIC WAVE DEVICE

BACKGROUND OF THE INVENTION

This invention relates to a surface acoustic wave device operable in a high-frequency band and, in particular, to a surface acoustic wave device comprising a ZnO piezoelectric thin film layer formed on a diamond layer or a substrate with a diamond film formed thereon.

A conventional surface acoustic wave device comprises a diamond layer or a substrate with a diamond layer formed thereon, an Al (aluminum) electrode formed on the diamond layer, and a ZnO (zinc oxide) piezoelectric thin film layer formed on the diamond layer and the Al electrode. The conventional surface acoustic wave device has a propagation velocity as high as 10,000 m/s and is therefore useful for exciting a high-frequency surface acoustic wave of, for example, a center frequency of 2.5 Ghz or the like when an array of electrodes Is arranged at an electrode period corresponding to a wavelength (for example, 4 $\mu$m) of the surface acoustic wave. Practically, the electrode period may be substantially equivalent to the wavelength of the surface acoustic wave.

In order to achieve a similar high-frequency operation, another conventional surface acoustic wave device comprises a single crystal piezoelectric substrate and a metal thin film electrode formed on the substrate. With this structure, a very fine machining process is required to form electrode fingers of a dimension on the order of submicrons. For example, the electrode period must be as small as 1.3 $\mu$m and 1.6 $\mu$m in an ST-cut quartz substrate and a 128° Y-X LiNbO$_3$ (lithium niobate) substrate, respectively.

On the other hand, such a very fine machining process is not required in the first-mentioned conventional surface acoustic wave device comprising the diamond layer or the substrate with the diamond layer formed thereon, the Al electrode, and the ZnO piezoelectric thin film layer. Such a surface acoustic wave device is disclosed, for example, in Japanese Unexamined Patent Publication (A) No. 83078/1993.

In the second-mentioned conventional surface acoustic wave device using the single crystal piezoelectric substrate, acoustic impedances of the metal thin film electrode differ between a portion where the electrode fingers are laid and a free surface portion where no electrode finger is laid. This results in occurrence of acoustic reflection of a surface acoustic wave at the electrode fingers.

Likewise, in the first-mentioned conventional surface acoustic wave device comprising the diamond layer or the substrate with the diamond layer formed thereon, the Al electrode, and the ZnO piezoelectric thin film layer, an acoustic impedance of the electrode portion of the Al electrode is not matched with an acoustic impedance of the free surface portion. Such discontinuity of the acoustic impedance results in occurrence of the acoustic reflection.

If addition, let an interdigital electrode structure of single electrode fingers having a width of $\lambda$/4 be used in the first-mentioned conventional surface acoustic wave device comprising the diamond layer or the substrate with the diamond layer formed thereon, the Al electrode, and the ZnO piezoelectric thin film layer. In this event, the acoustic reflection at the electrode portion causes a ripple to occur in a main lobe of an attenuation characteristic of the device. In order to eliminate such acoustic internal reflection, it has been proposed to use an interdigital electrode structure of electrode fingers having a width of $\lambda$/8. However, a merit of a high propagation velocity can not be effectively utilized.

SUMMARY OF THE INVENTION

It is therefore an object of this invention to provide a surface acoustic wave device which is capable of eliminating acoustic reflection of a surface wave and, as a result, achieving a ripple-free single-peak characteristic in a main lobe of an attenuation characteristic even when an interdigital electrode structure is used which is composed of electrode fingers of a width of $\lambda$/4.

It is another object of this invention to provide a surface acoustic wave device of the type described, wherein a benefit of a high propagation velocity of the surface wave can be effectively utilized as a characteristic of the device.

A surface acoustic wave device to which this invention is applicable is for use in propagating a surface wave of a surface wavelength and which has a base, an electrode arranged on the base at an electrode period related to the surface wavelength, and a piezoelectric layer coated on the electrode and the piezoelectric layer. According to an aspect of this invention, the piezoelectric layer and the electrode has first and second thicknesses both of which are determined in relation to the wavelength of the surface wave with the electrode period kept substantially equal to the wavelength.

The base may include a diamond layer while the electrode and the piezoelectric layer may be composed of Al and ZnO.

According to another aspect of this invention, the ZnO piezoelectric layer has a thickness h1 within a range defined by $0.65 \leq kh1 \leq 0.75$ while the Al electrode has a thickness h2 within a range defined by $0.03 \leq kh2 \leq 0.04$, where k is given by $k = 2\pi/\lambda$ and $\lambda$ represents the electrode period.

DESCRIPTION OF THE PREFERRED EMBODIMENT

Figure 1:
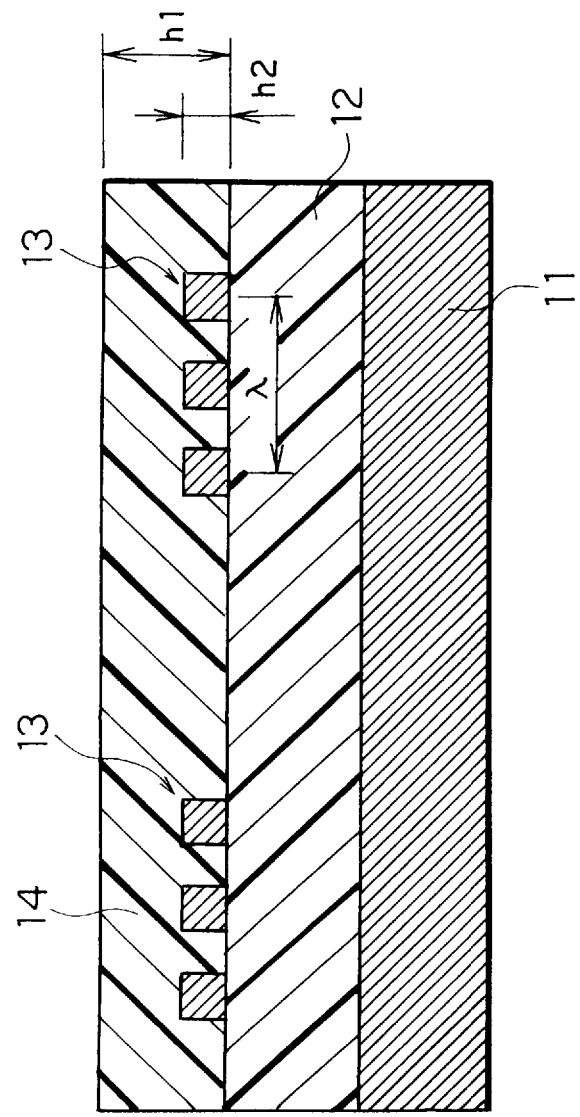
FIG. 1 is a sectional view of a surface acoustic wave device according to one embodiment of this invention.

Now, description will be made as regards an embodiment of this invention with reference to the drawing.

Referring to FIG. 1, a surface acoustic wave device according to this invention utilizes a primary mode of an excited surface acoustic wave and comprises a Si (silicon) substrate 11, a diamond layer 12 formed on the Si substrate 11, and an Al electrode portion 13 of an interdigital electrode structure arranged on the diamond layer 12, and a ZnO piezoelectric thin film layer 14 formed on the diamond layer 12 and the Al electrode portion 13.

In this embodiment, the ZnO piezoelectric thin film layer 14 has a thickness hi within a range defined by $0.65 \leq kh1 \leq 0.75$ while the Al electrode portion 13 has a thickness h2 within a range defined by $0.03 \leq kh2 \leq 0.04$, where k is given by $k=2\pi/\lambda$ and may be called a wave number where in turn $\lambda$ represents a surface pitch.

Next, a structural feature of the surface acoustic wave device will be described. Generally, when the interdigital electrode structure is composed of single electrode fingers of a width of $\lambda/4$, a ripple is caused to occur in a main lobe of an attenuation characteristic of the device if acoustic reflection is caused at the electrode portion. Such acoustic reflection results from discontinuity of an acoustic impedance between the Al electrode portion 13 and a free surface portion where no electrode finger is present. Specifically, the acoustic reflection objectionably occurs when an acoustic impedance ratio $\tau$ between the Al electrode portion 13 and the free surface portion is not equal to unity ($\tau \neq 1$). Herein, the acoustic Impedance ratio $\tau$ is given by:

$$\tau = Zm/Zo = 1 + \alpha,$$

where Zm represents the acoustic impedance of the Al electrode portion; Zo, the acoustic impedance of the free surface portion; and $\alpha$, a discontinuous impedance coefficient.

In the interim, the acoustic impedance ratio $\tau$ will be described with reference to FIGS. 4 through 8 for a better understanding of this invention.

Figure 4:
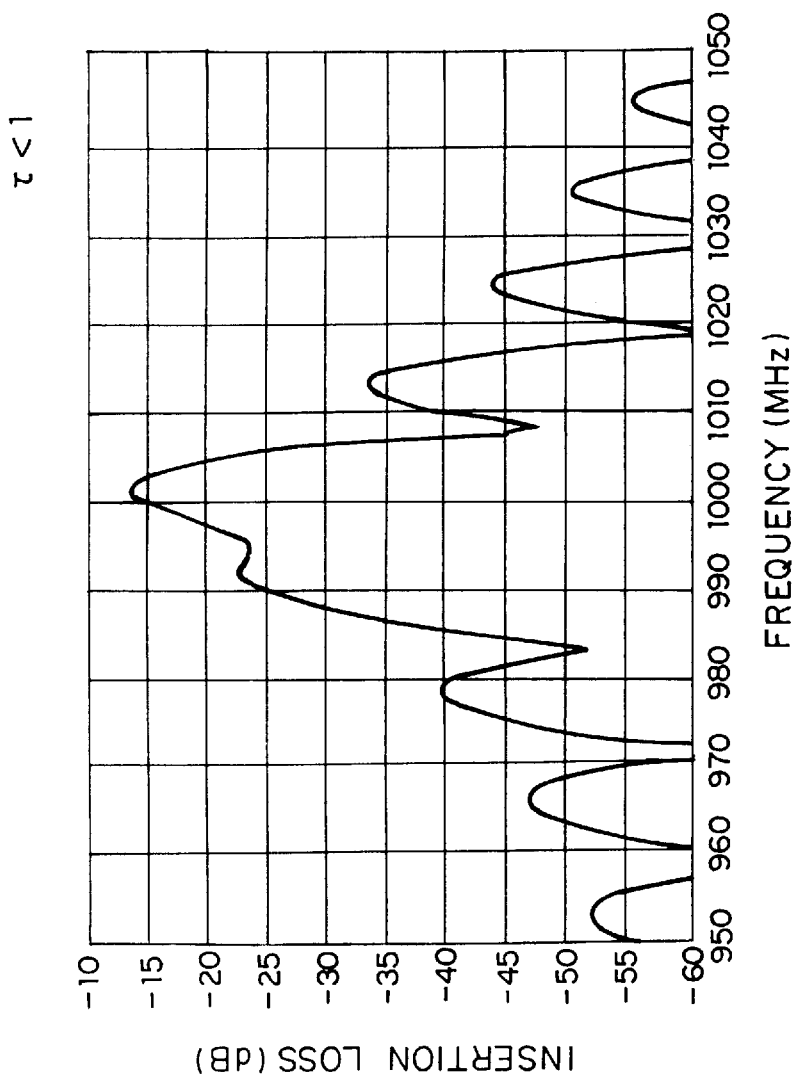
FIG. 4 shows, as a calculation result, the attenuation characteristic in case where an acoustic impedance ratio between an Al electrode portion and a free surface portion is smaller than unity.
Figure 5:
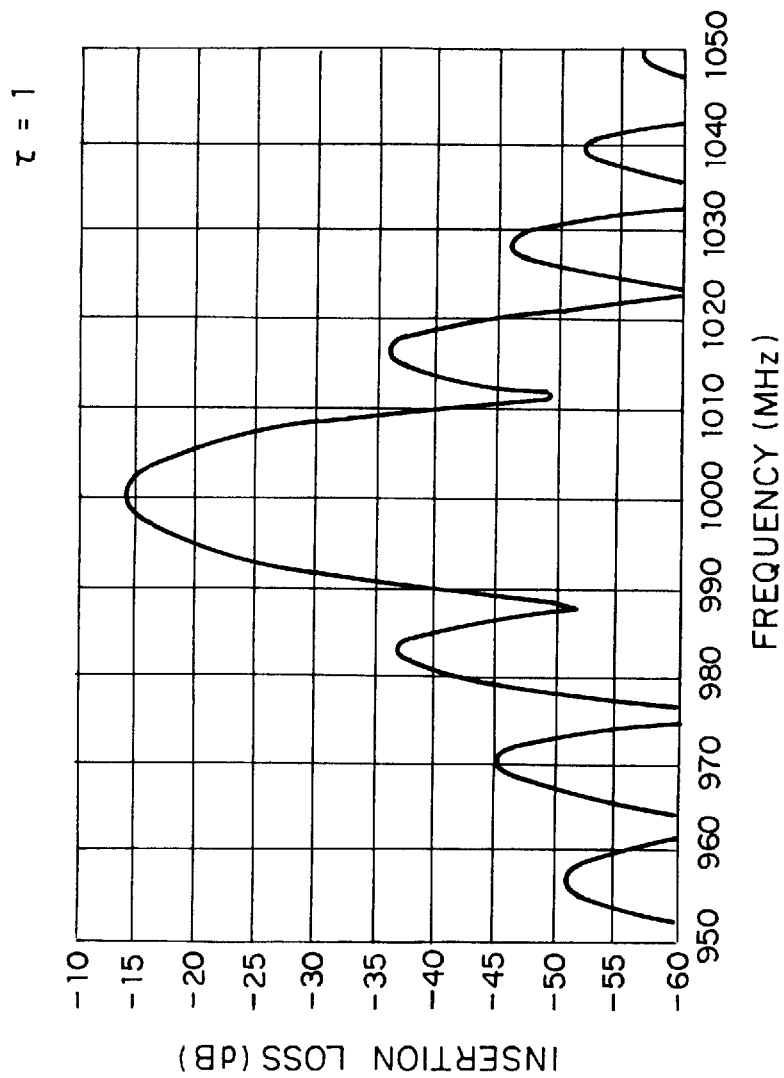
FIG. 5 shows, as a calculation result, the attenuation characteristic in case where the acoustic impedance ratio is equal to unity.
Figure 6:
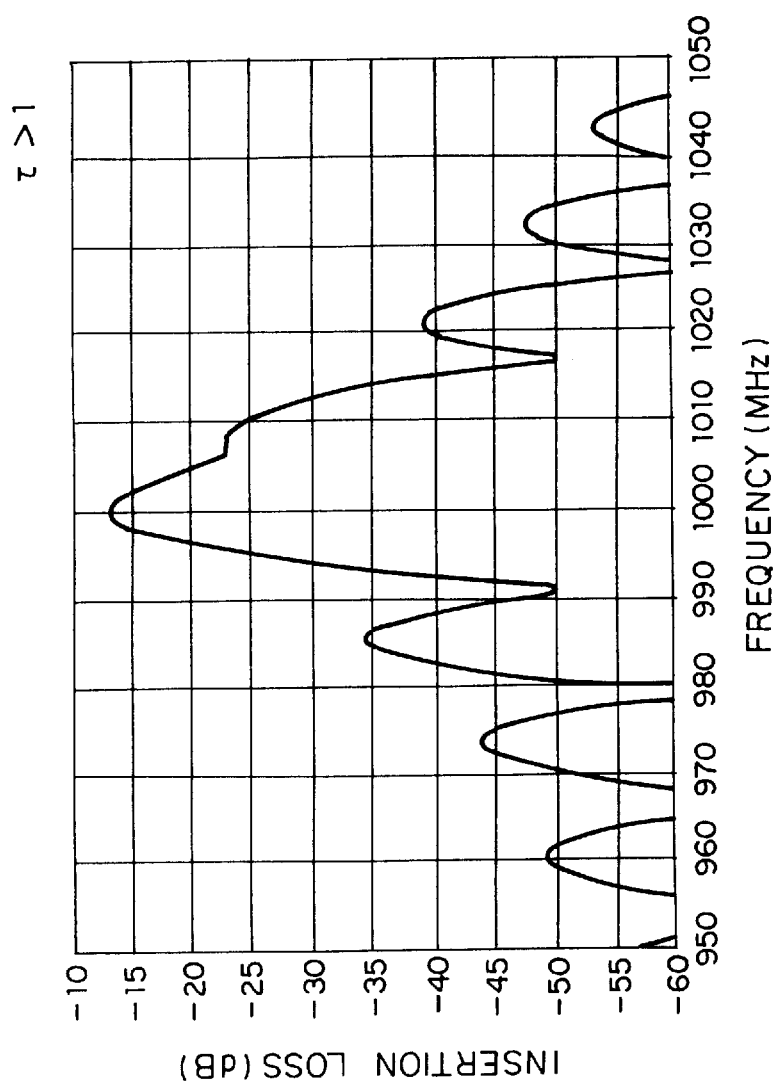
FIG. 6 shows, as a calculation result, the attenuation characteristic in case where the acoustic impedance ratio is greater than unity.

Consideration is made about an influence of the acoustic impedance ratio $\tau$ upon the attenuation characteristic. In FIGS. 4 through 6, the influence has been simulated using equivalent circuit models each of which is specified by the acoustic impedance ratio $\tau$. FIGS. 4, 5, and 6 show, as simulation results, the attenuation characteristics obtained when the acoustic impedance ratio $\tau$ is smaller than unity ($\tau<1$), equal to unity ($\tau=1$), and greater than unity ($\tau>1$), respectively. As will be understood by comparing FIGS. 4 through 6 with one another, the ripple appears in the main lobe in dependence upon the value of the acoustic impedance ratio $\tau$. Specifically, when the acoustic impedance ratio $\tau$ is equal to 1 ($\tau=1$) as shown in FIG. 5, the main lobe exhibits a single-peak characteristic without the ripple. On the other hand, when the acoustic impedance ratio $\tau$ is smaller and greater than unity ($\tau<1$ and $\tau>1$) as shown in FIGS. 4 and 6, the ripple appears in the main lobe.

Figure 7:
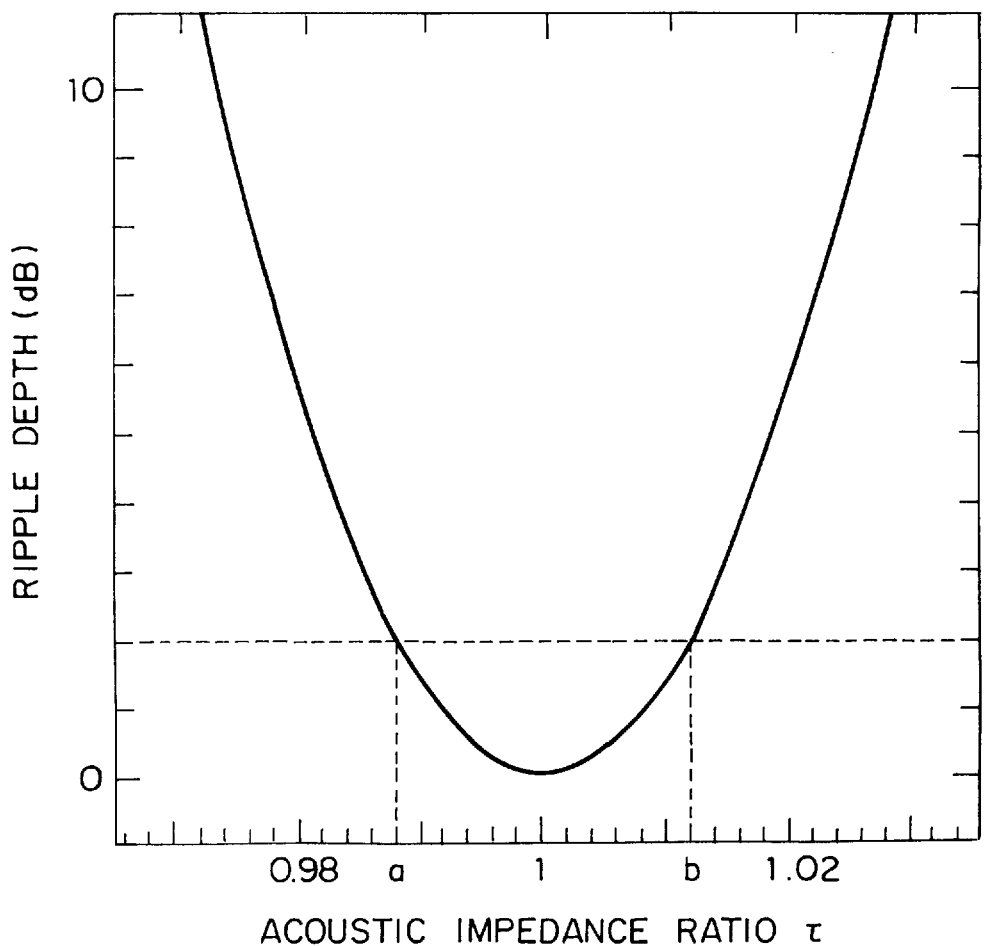
FIG. 7 shows a relationship between a ripple depth and the acoustic impedance ratio.

Referring to FIG. 7, a relationship between a ripple depth and the acoustic impedance ratio $\tau$ is illustrated which is obtained as a result of calculation. Let a range be defined wherein no consideration may be made about a substantial influence of the ripple upon the attenuation characteristic because the ripple depth is substantially negligible. Under the circumstances, the acoustic impedance ratio $\tau$ has a specific zone which corresponds to the above-mentioned range and which may be effectively regarded as "1" for convenience of description. In FIG. 7, when the ripple depth is as small as 2 dB in the above-mentioned range, the specific zone of the acoustic impedance ratio $\tau$ is defined between "a" (=0.988) and "b" (=1.012). Thus, the acoustic impedance ratio $\tau$ within the above-mentioned range takes the effective "unity" value which causes no ripple to occur in the main lobe.

Figure 8:
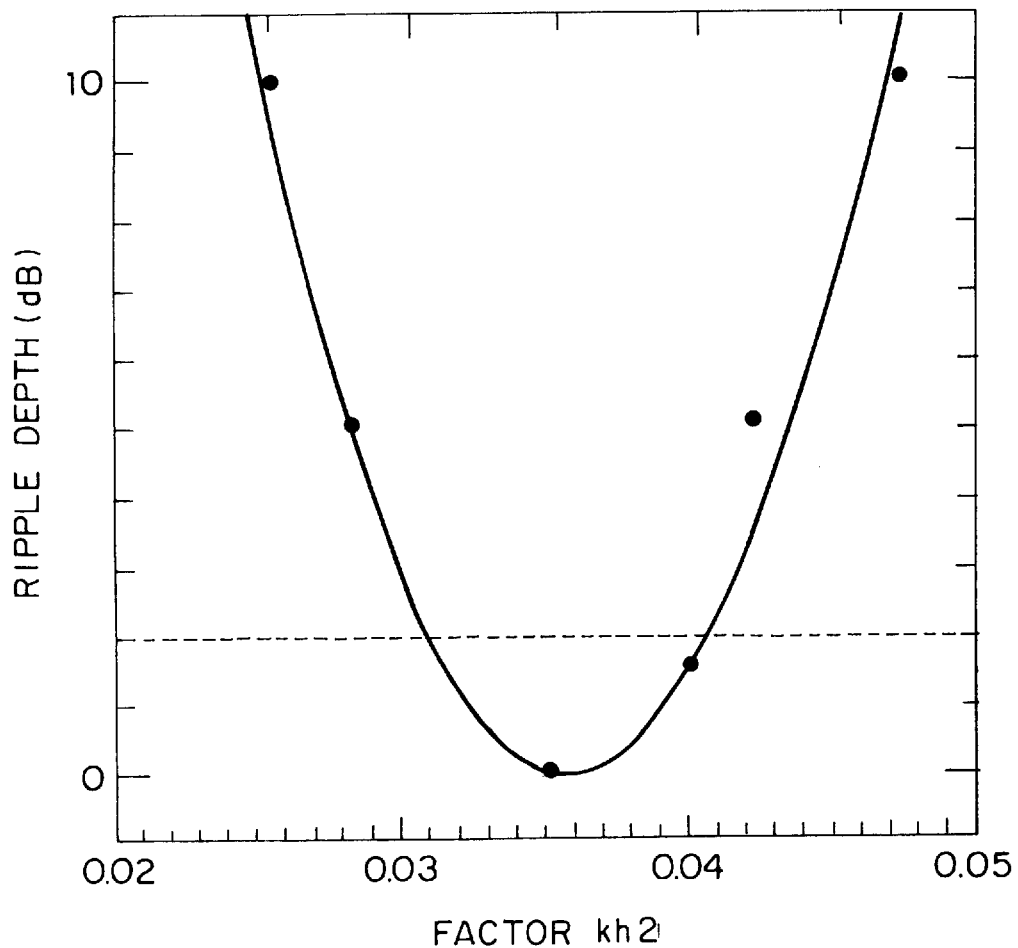
FIG. 8 shows a relationship between the ripple depth and kh2 corresponding to an electrode film thickness (h2) of the Al electrode portion in case where a ZnO piezoelectric thin film layer has a predetermined thickness (h1) determined by kh1=0.7.

Referring to FIG. 8, a relationship between the ripple depth and kh2 (corresponding to the thickness h2 of the Al electrode portion 13) has been experimentally obtained for the ZnO piezoelectric thin film layer 14 having a thickness hi defined by kh1=0.7. In FIG. 8, the value of kh2 corresponding to the sufficiently small ripple depth having no substantial influence approximately falls within a range defined by $0.03 \leq kh2 \leq 0.04$. Accordingly, it will be understood that the above-mentioned range of kh2 corresponds to the acoustic impedance ratio $\tau$ having the effective "unity" value ($\tau=1$). The similar result has been obtained in another experiment similar to FIG. 8 but for the ZnO piezoelectric thin film layer 14 with the thickness h1 varied within a range defined by $0.65 \leq kh1 \leq 0.75$.

As described above, in case where the Interdigital electrode structure is composed of the electrode fingers of a width of $\lambda/4$, the ripple is caused to occur in the main lobe of the attenuation characteristic if the acoustic reflection is produced at the electrode portion. According to this invention, the surface acoustic wave device comprises the diamond layer or the Si substrate 11 with the diamond layer formed thereon, the Al electrode portion 13 formed on the diamond layer, and the ZnO piezoelectric thin film layer 14 formed on the diamond layer and the Al electrode portion 13. The ZnO piezoelectric thin film layer 14 has the thickness h1 defined by $0.65 \leq kh1 \leq 0.75$ while the Al electrode portion 13 has the thickness h2 defined by $0.03 \leq kh2 \leq 0.04$, where k is given by $k=2\pi/\lambda$ and A represents the electrode period. With this structure, the acoustic impedance-ratio $\tau$ between the Al electrode portion 13 and the free surface portion has the effective "unity" value so that no acoustic reflection is caused to occur. As a result, the main lobe of the attenuation characteristic exhibits a ripple-free characteristic.

Figure 2:
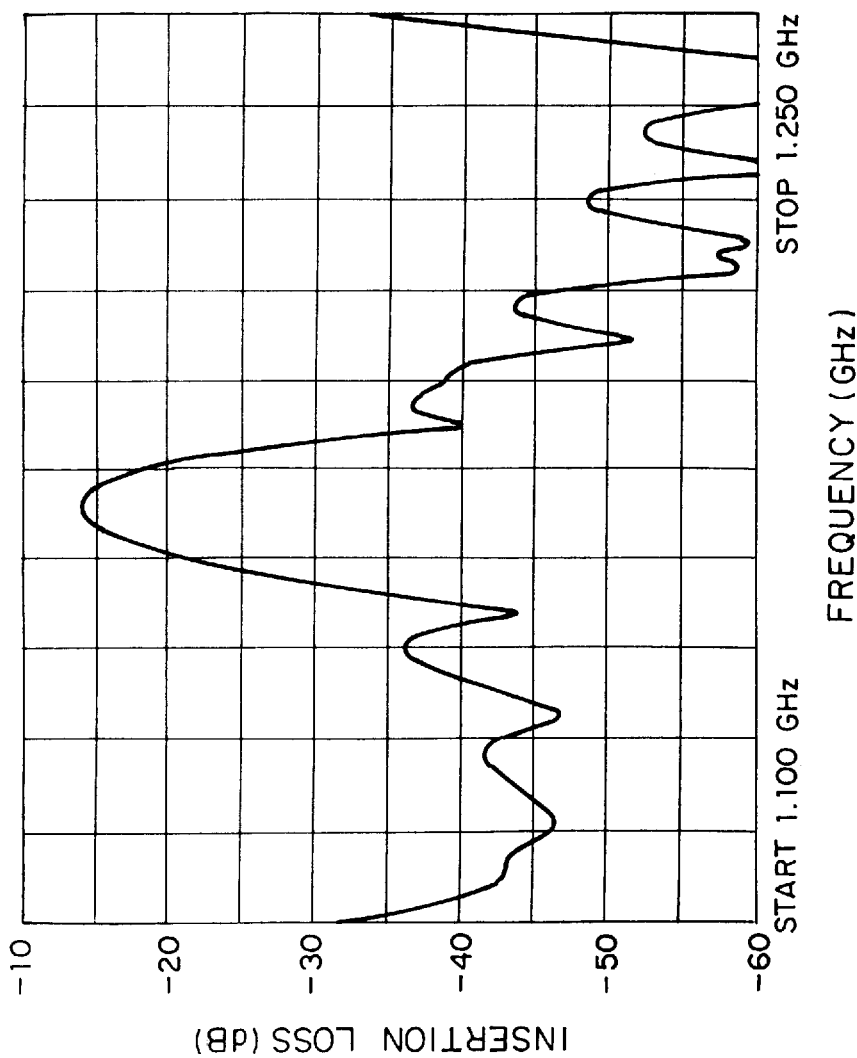
FIG. 2 shows, as an experimental result, an attenuation characteristic of the surface acoustic wave device In FIG. 1.

Referring to FIG. 2, the attenuation characteristic of the surface acoustic wave device of this invention is shown as an experimental result. As seen from the figure, the main lobe has a single-peak characteristic without the ripple resulting from the acoustic reflection at the electrode fingers (Al electrode portion 13). The experiment was carried out under the condition which will presently be described.

(A) Input/Output Interdigital Electrode Structure wavelength ($\lambda$): 8 $\mu$m Electrode Width: $\lambda/4$ Number of Finger Pairs: 40

Width of Interdigital Structure: $50\lambda$(400 $\mu$m)

Electrode Film Thickness (h2): kh2=0.035 (0.045 $\mu$m)

(B) Diamond Thin Film

Polycrystalline Diamond Film (Hot-Filament CVD)

Film Thickness: 20 $\mu$m (C) ZnO Thin Film

C-axis Orientation Film (Sputtering)

($\sigma$value=2° in evaluation by the use of an X-ray rocking curve)

Film Thickness (h1): kh1=0.7 (0.89 $\mu$m)

Figure 3:
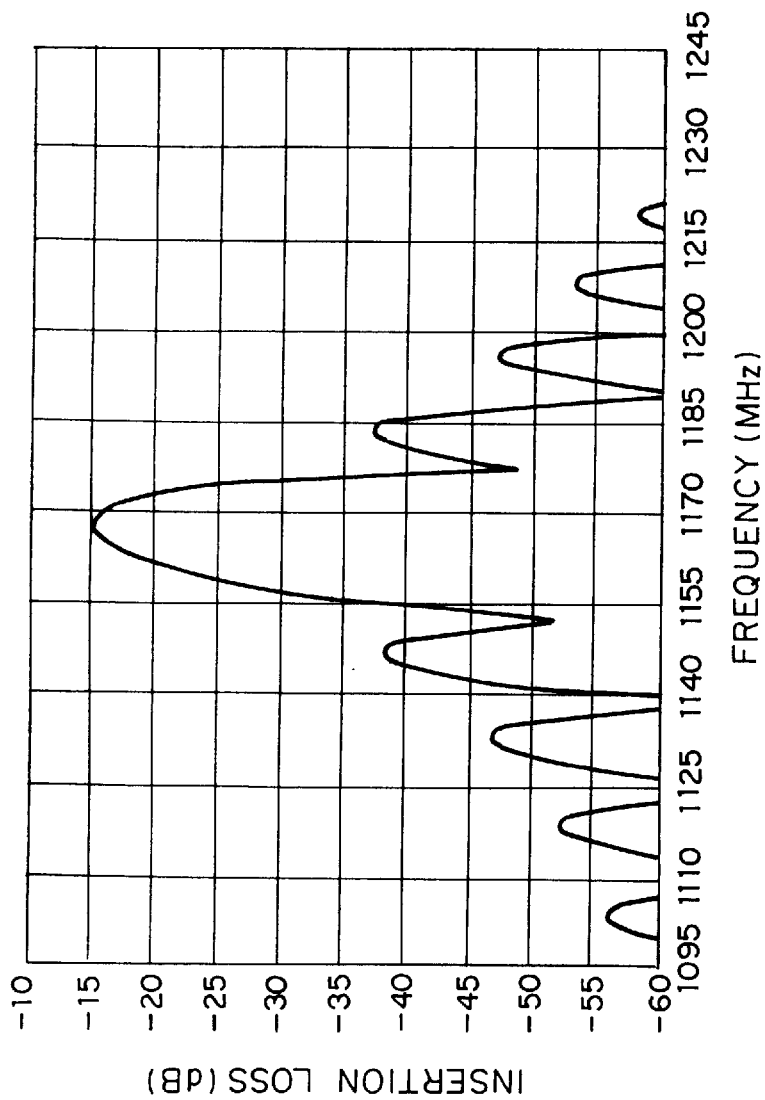
FIG. 3 shows, as a simulation result, the attenuation characteristic of the surface acoustic wave device in FIG. 1.

Referring to FIG. 3, the attenuation characteristic of the surface acoustic wave device of this invention is simulated as a result of calculation. As seen from the figure, the single-peak characteristic without the ripple is reproduced in the main lobe. The calculation was carried out under the condition set forth below.

(A) Input/Output Interdigital Electrode Structure

Electrode width: $\lambda/4$

Number of Finger Pairs: 40

Width of Interdigital Structure: $50\lambda$

Acoustic Impedance Ratio ($\tau$): 1.0

Figure 9:
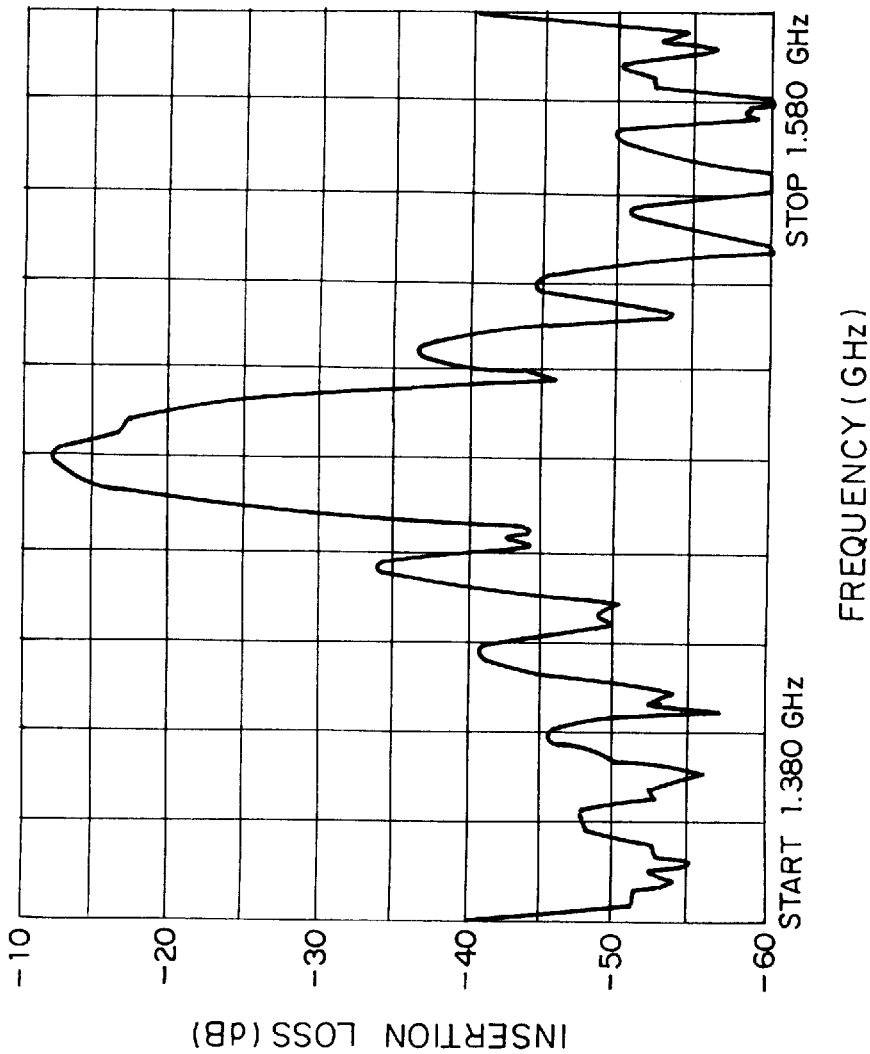
FIG. 9 shows, as an experimental result, an attenuation characteristic of a comparative surface acoustic wave device with an Al electrode portion having a thickness different from that specified in this invention.

Referring to FIG. 9, an experimental result was obtained in a comparative surface acoustic wave device having a different dimensional value. Specifically, the ZnO piezoelectric thin film layer 14 has a thickness h1 defined by kh1=0.7 which Is equal to that in the experiment of FIG. 2 while the Al electrode portion 13 has a thickness h2 defined by kh2=0.47. The other conditions are quite similar to those described In conjunction with FIG. 2. As seen from FIG. 9, the ripple appears in the main lobe of the attenuation characteristic.

Figure 10:
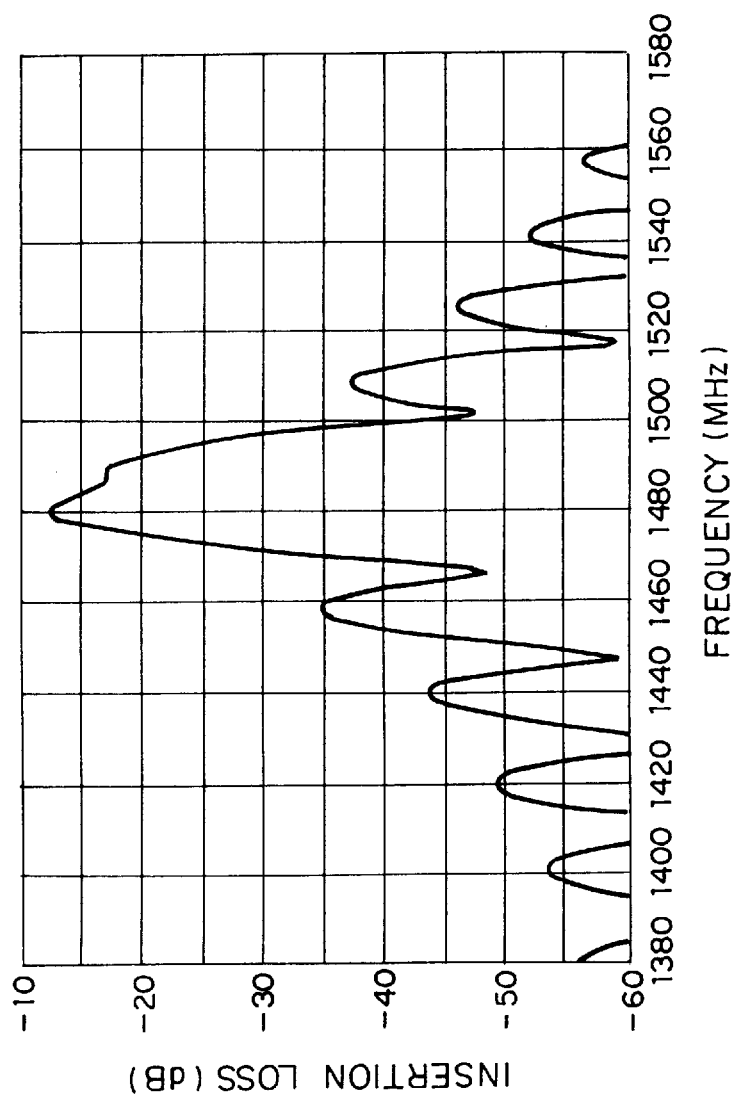
FIG. 10 shows, as a simulation result, the attenuation characteristic of the comparative surface acoustic wave device described in conjunction with FIG. 9

Referring to FIG. 10, the attenuation characteristic of the comparative surface acoustic wave device was obtained as a result of calculation. The acoustic impedance ratio $\tau$ is varied from 1 to 1.027. The ripple having the depth similar to the experimental value in FIG. 9 is reproduced when the acoustic impedance ratio $\tau$ is equal to 1.027.

As described above, in the surface acoustic wave device of this invention, the acoustic impedance ratio between the Al electrode portion and the free surface portion is made to have the effective "unity" value. Therefore, the acoustic reflection of the surface wave is eliminated so that the main lobe of the attenuation characteristic exhibits the single-peak characteristic without the ripple even if the Al electrode portion has the interdigital electrode structure composed of the electrode fingers of a width of $\lambda/4$. It in therefore unnecessary to use, as in the conventional device, the interdigital electrode structure composed of the electrode fingers of a width of $\lambda/8$ in order to eliminate the acoustic reflection. Accordingly, it is possible to effectively utilize, as a characteristic of the surface acoustic wave device, the benefit of the high propagation velocity of the surface wave.

While this invention has thus far been described in conjunction with the single preferred embodiment thereof, it will readily be understood for those skilled in the art to put this invention in various other manners.

What is claimed is:

1. A surface acoustic wave device comprising a base including a diamond layer, an Al electrode arranged on said diamond layer at an electrode period, and a ZnO piezoelectric thin film layer formed on said diamond layer with said Al electrode covered with said ZnO piezoelectric thin film layer, wherein:

said ZnO piezoelectric thin film layer has a thickness h1 within a range defined by $0.65 \leq kh1 \leq 0.75$ while said Al electrode has a thickness h2 within a range defined by $0.03 \leq kh2 \leq 0.04$, where k is given by $k=2\pi/\lambda$ and $\lambda$ represents the electrode period.

2. A surface acoustic wave device as claimed in claim 1, wherein said base is formed by a selected one of said diamond layer alone and a substrate covered with said diamond layer.

3. A surface acoustic wave device comprising a base including a diamond layer, an Al electrode formed on said diamond layer, and a ZnO piezoelectric thin film layer formed on said diamond layer with said Al electrode covered with said ZnO piezoelectric thin film layer, wherein:

said ZnO piezoelectric thin film layer has a predetermined thickness while said Al electrode has a thickness within a range such that acoustic reflection at said Al electrode is substantially equal to zero.

4. A surface acoustic wave device as claimed in claim 3, wherein said base is formed by a selected one of said diamond layer alone and a substrate covered with said diamond layer.

5. A surface acoustic wave device an claimed in claim 3, wherein said ZnO piezoelectric thin film layer has a thickness h1 defined by kh1=0.70 while said Al electrode has a thickness h2 within a range defined by $0.03 \leq kh2 \leq 0.04$, where k is given by $k=2\pi/\lambda$, and $\lambda$ represents an electrode period.

6. A surface acoustic wave device which is for use in propagating a surface wave of a surface wavelength and which has a base, an electrode arranged on said base at an electrode period related to the surface wavelength, and a piezoelectric layer coated on said electrode and said piezoelectric layer, wherein:

said piezoelectric layer and said electrode have first and second thicknesses both of which are determined in relation to the wavelength of the surface wave such that acoustic reflection at said electrode is substantially equal to zero; and with the electrode period kept substantially equal to the wavelength.

7. A surface acoustic wave device as claimed in claim 6, wherein said base is formed by a selected one of a diamond layer and a substrate covered with a diamond layer while said electrode and said piezoelectric layer are attached to said diamond layer.

8. A surface acoustic wave device as claimed in claim 7, wherein said piezoelectric layer is formed by ZnO while said electrode is formed by Al.

9. A surface acoustic wave device as claimed in claim 8, wherein said piezoelectric layer has a thickness h1 within a range defined by $0.65 \leq kh1 \leq 0.75$ while said electrode has a thickness h2 within a range defined by $0.03 \leq kh2 \leq 0.04$, where k is given by $k=2\pi/\lambda$ and $\lambda$ represents the wavelength.

* * * * *

UNITED STATES PATENT AND TRADEMARK OFFICE
CERTIFICATE OF CORRECTION

PATENT NO.    : 5,888,646
DATED         : March 30, 1999
INVENTOR(S)   : Yoshihiro TAKAHASHI, Yasushi YAMAMOTO,
                Natsuhiko SAKAIRI, Shin-Ichi SHIKATA, Hideaki NAKAHATA,
                Kenjiro HIGAKI, Satoshi FUJII and Hiroyuki KITABAYASHI It is certified that error(s) appears in the above-identified patent and that said Letters Patent is hereby corrected as shown below:

Column 3,   line 10,   delete "hi" and insert --h1--;

Column 4,   line 8,    delete "hi" and insert --h1--;

Column 4,   line 31,   delete "A" and insert --$\lambda$--;

Column 5,   line 30,   delete "in" and insert --is--.

Signed and Sealed this

Thirtieth Day of November, 1999

Attest:

Q. TODD DICKINSON

Attesting Officer

Acting Commissioner of Patents and Trademarks